US011108262B2

(12) United States Patent
Lee et al.

(10) Patent No.: US 11,108,262 B2
(45) Date of Patent: Aug. 31, 2021

(54) PHOTOVOLTAIC MODULE AND PHOTOVOLTAIC SYSTEM INCLUDING THE SAME

(71) Applicant: LG ELECTRONICS INC., Seoul (KR)

(72) Inventors: Suchang Lee, Seoul (KR); Youngchan Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 334 days.

(21) Appl. No.: 15/586,953

(22) Filed: May 4, 2017

(65) Prior Publication Data

US 2017/0324269 A1    Nov. 9, 2017

(30) Foreign Application Priority Data

May 4, 2016 (KR) .................. 10-2016-0055472

(51) Int. Cl.
*H02J 7/35* (2006.01)
*H01L 31/02* (2006.01)
(Continued)

(52) U.S. Cl.
CPC .......... *H02J 7/35* (2013.01); *H01L 31/02021* (2013.01); *H01L 31/0504* (2013.01);
(Continued)

(58) Field of Classification Search
CPC .......... H02J 7/355; H02S 40/32; H02S 40/34; H01L 31/02021
(Continued)

(56) References Cited

U.S. PATENT DOCUMENTS 4,342,318 A * 8/1982 Engle ................... A61B 5/0456
600/521
6,278,598 B1 * 8/2001 Suzuki ..................... G06F 1/26
307/125
(Continued)

FOREIGN PATENT DOCUMENTS

DE 102013110240 A1 3/2015
EP 2369708 A1 9/2011
(Continued)

*Primary Examiner* — David V Henze-Gongola
*Assistant Examiner* — Tarikh Kanem Rankine
(74) *Attorney, Agent, or Firm* — Birch, Stewart, Kolasch & Birch, LLP

(57) ABSTRACT

Discussed are a photovoltaic module and a photovoltaic system including the same. According to an embodiment, the photovoltaic module includes a solar cell module including a plurality of solar cells, and a junction box attached to a back surface of the solar cell module, wherein the junction box includes a capacitor unit to store a direct current (DC) power from the solar cell module, and a shutdown unit disposed at a front end of the capacitor unit and to operate to consume the DC power stored in the capacitor unit and temporarily interrupt power output of the solar cell module when the DC power from the solar cell module is outside of a permissible range. Thus, when DC power outside of the permissible range is supplied, the power output can be quickly interrupted while the DC power stored in the capacitor is consumed.

15 Claims, 13 Drawing Sheets

(51) Int. Cl.
*H02S 40/32* (2014.01)
*H02S 40/34* (2014.01)
*H01L 31/05* (2014.01)
*H02J 7/00* (2006.01)
*H02S 50/10* (2014.01)
*H02J 7/34* (2006.01)

(52) U.S. Cl.
CPC .......... *H02J 7/0029* (2013.01); *H02J 7/0068* (2013.01); *H02S 40/32* (2014.12); *H02S 40/34* (2014.12); *H02J 7/00302* (2020.01); *H02J 7/345* (2013.01); *H02S 50/10* (2014.12); *Y02E 10/50* (2013.01)

(58) Field of Classification Search
USPC ........................................................ 320/101
See application file for complete search history.

(56) References Cited

U.S. PATENT DOCUMENTS

| | | | | |
|---|---|---|---|---|
| 6,339,538 | B1* | 1/2002 | Handleman | G05F 1/67 |
| | | | | 136/293 |
| 7,729,143 | B2 | 6/2010 | Lin et al. | |
| 2009/0097172 | A1* | 4/2009 | Bremicker | H01H 9/542 |
| | | | | 361/8 |
| 2011/0140530 | A1* | 6/2011 | Demetriades | H02J 3/36 |
| | | | | 307/77 |
| 2011/0144822 | A1* | 6/2011 | Choi | H02J 3/32 |
| | | | | 700/297 |
| 2011/0187200 | A1* | 8/2011 | Yin | H02J 3/383 |
| | | | | 307/86 |
| 2012/0056484 | A1* | 3/2012 | Mumtaz | H02M 7/44 |
| | | | | 307/86 |
| 2012/0101645 | A1* | 4/2012 | Jun | G05F 1/67 |
| | | | | 700/287 |
| 2012/0262948 | A1* | 10/2012 | Lee | H02S 50/00 |
| | | | | 363/16 |
| 2013/0009483 | A1* | 1/2013 | Kawate | H02J 3/383 |
| | | | | 307/77 |
| 2013/0099760 | A1* | 4/2013 | Shizuya | H01L 31/02021 |
| | | | | 323/271 |
| 2013/0147275 | A1* | 6/2013 | Bettenwort | H02J 3/383 |
| | | | | 307/43 |
| 2013/0193775 | A1* | 8/2013 | Lee | H02M 3/1584 |
| | | | | 307/151 |
| 2014/0176043 | A1* | 6/2014 | Fujiyama | H02J 7/00 |
| | | | | 320/101 |
| 2016/0006392 | A1 | 1/2016 | Höft | |
| 2016/0036235 | A1* | 2/2016 | Getsla | H02J 3/383 |
| | | | | 307/80 |
| 2016/0126367 | A1* | 5/2016 | Dunton | H01L 31/02021 |
| | | | | 307/115 |
| 2016/0172863 | A1* | 6/2016 | Robbins | H02J 3/381 |
| | | | | 323/234 |
| 2016/0190798 | A1* | 6/2016 | Narla | H02H 7/20 |
| | | | | 307/80 |
| 2016/0294189 | A1* | 10/2016 | Uno | G05F 1/67 |
| 2017/0012431 | A1* | 1/2017 | Benton | H02H 5/047 |

FOREIGN PATENT DOCUMENTS

| | | |
|---|---|---|
| JP | 2010-512139 A | 4/2010 |
| JP | 2015-6074 A | 1/2015 |
| JP | 2015-139367 A | 7/2015 |
| KR | 10-2014-0010218 A | 1/2014 |
| WO | WO 2015/039998 A2 | 3/2015 |

\* cited by examiner

FIG. 2
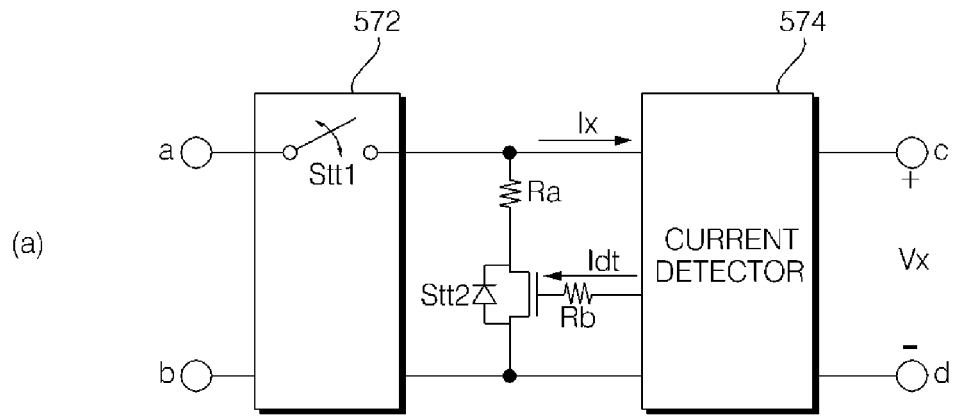
(a)
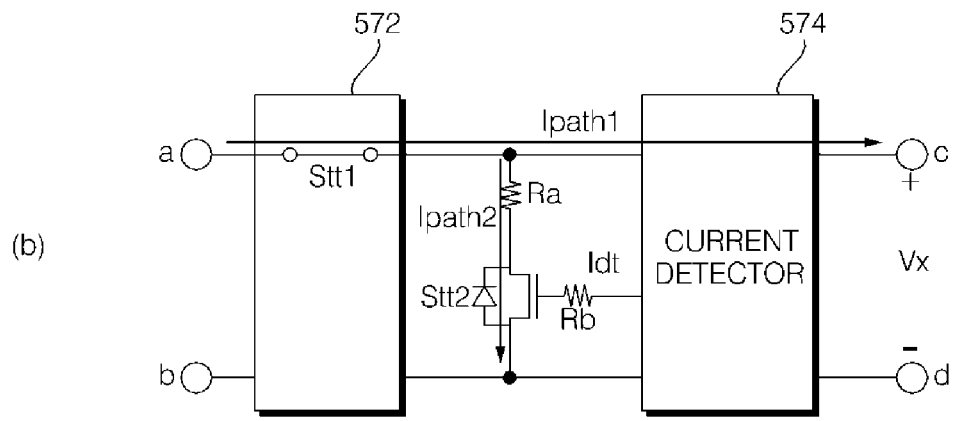
(b)
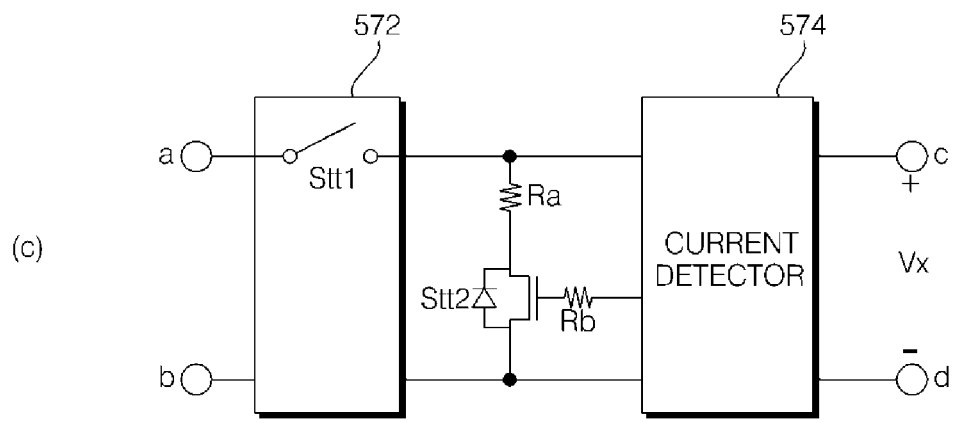
(c)

FIG. 5
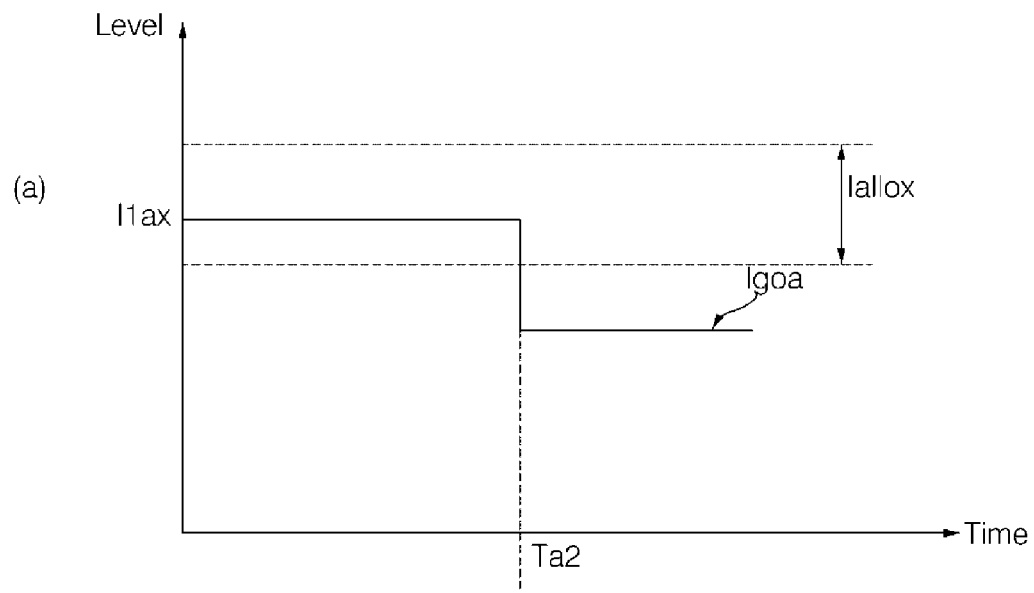
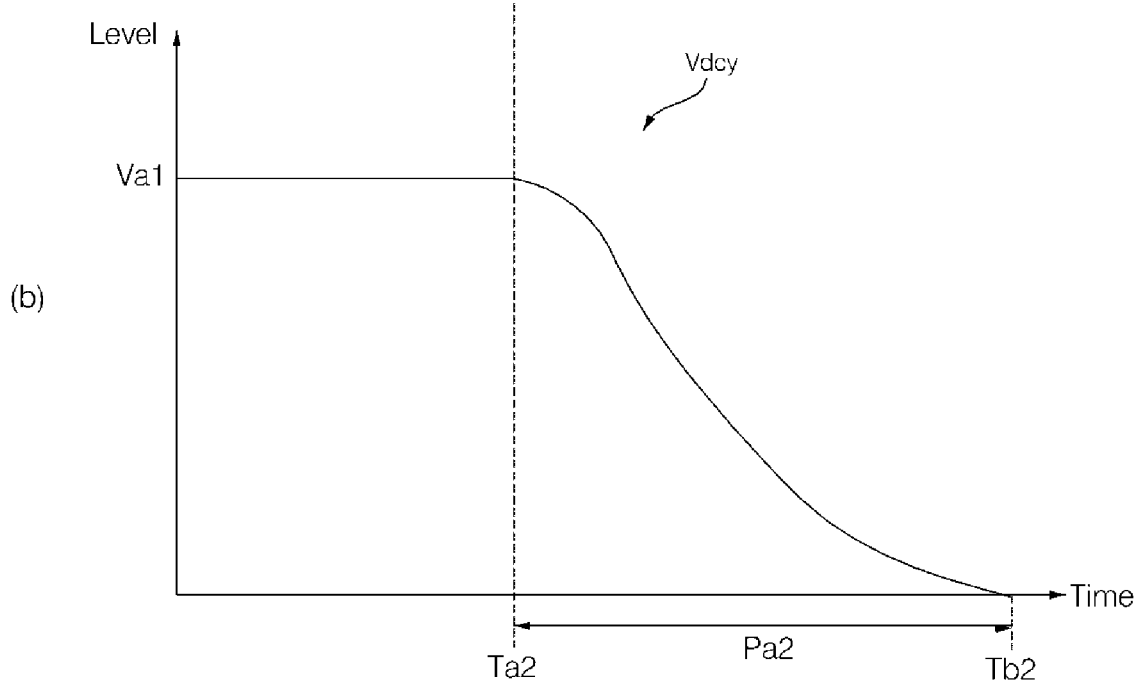

PHOTOVOLTAIC MODULE AND PHOTOVOLTAIC SYSTEM INCLUDING THE SAME

CROSS-REFERENCE TO RELATED APPLICATION

This application claims the priority benefit of Korean Patent Application No. 10-2016-0055472, filed on May 4, 2016 in the Korean Intellectual Property Office, the disclosure of which is incorporated herein by reference in its entirety.

BACKGROUND OF THE INVENTION

1. Field of the Invention

Embodiment of the present invention relate to a photovoltaic module and a photovoltaic system including the same, and more particularly, to a photovoltaic module capable of quickly interrupting power output while consuming DC power stored in a capacitor unit when DC power outside of a permissible range is supplied.

2. Description of the Related Art

Recently, as existing energy resources such as oil and coal are being depleted, interest in alternative energy resources is increasing. Among such alternative energy resources, solar cells, which convert solar energy directly into electric energy using semiconductor devices, are attracting attention.

The photovoltaic module refers to solar cells for solar power generation that are connected in series or in parallel.

When a photovoltaic system is implemented using DC power output from a plurality of photovoltaic modules, a quick shutdown is needed in instances of an abnormal operation to protect the system.

SUMMARY OF THE INVENTION

Therefore, the embodiments of the present invention have been made in view of the above problems, and it is an object of the present invention to provide a solar module capable of quickly stopping power output while consuming DC power stored in the capacitor unit when DC power is supplied outside of the permissible range.

In accordance with an aspect of the present invention, the above and other objects can be accomplished by the provision of a photovoltaic module including a solar cell module including a plurality of solar cells, and a junction box attached to a back surface of the solar cell module, wherein the junction box includes a capacitor unit to store a direct current (DC) power from the solar cell module, and a shutdown unit disposed at a front end of the capacitor unit and to operate to consume the DC power stored in the capacitor unit and temporarily interrupt power output from the solar cell module when the DC power from the solar cell module is outside of a permissible range.

In accordance with another aspect of the present invention, there is provided a photovoltaic module including a solar cell module including a plurality of solar cells, and a junction box attached to a back surface of the solar cell module, wherein the junction box includes a capacitor unit to store a direct current (DC) power from the solar cell module, and a shutdown unit to operate to bypass and output the DC power from the solar cell module when the DC power from the solar cell module is within a permissible range and to interrupt the DC power output from the solar cell module and consume the DC power stored in the capacitor unit when the DC power from the solar cell module is outside of the permissible range.

In accordance with another aspect of the present invention, there is provided a photovoltaic system including a plurality of photovoltaic modules to convert a direct current (DC) power from a solar cell module and to output the converted DC power, and a string inverter to convert the DC power output from the plurality of photovoltaic modules into an alternating current (AC) power, wherein each of the plurality of photovoltaic modules includes a solar cell module including a plurality of solar cells, and a capacitor unit to store the DC power from the solar cell module, wherein at least one of the photovoltaic modules further includes a shutdown unit disposed at a front end of the capacitor unit and to operate to consume the DC power stored in the capacitor unit and temporarily interrupt power output when the DC power from the solar cell module is outside of a permissible range.

BRIEF DESCRIPTION OF THE DRAWINGS

The above and other objects, features and other advantages of the present invention will be more clearly understood from the following detailed description taken in conjunction with the accompanying drawings, in which:

FIG. 2 is a diagram showing an example of the shutdown unit in the solar module of FIG. 1;

FIG. 5 is a reference diagram illustrating the operation of the photovoltaic system of FIG. 4;

DETAILED DESCRIPTION OF THE EMBODIMENTS

Reference will now be made in detail to the embodiments of the present invention, examples of which are illustrated in the accompanying drawings. Wherever possible, the same reference numbers will be used throughout the drawings to refer to the same or like parts.

As used herein, the suffixes "module" and "unit" are added or used interchangeably to facilitate preparation of this specification and are not intended to suggest distinct meanings or functions. Accordingly, the terms "module" and "unit" may be used interchangeably.

Figure 1:
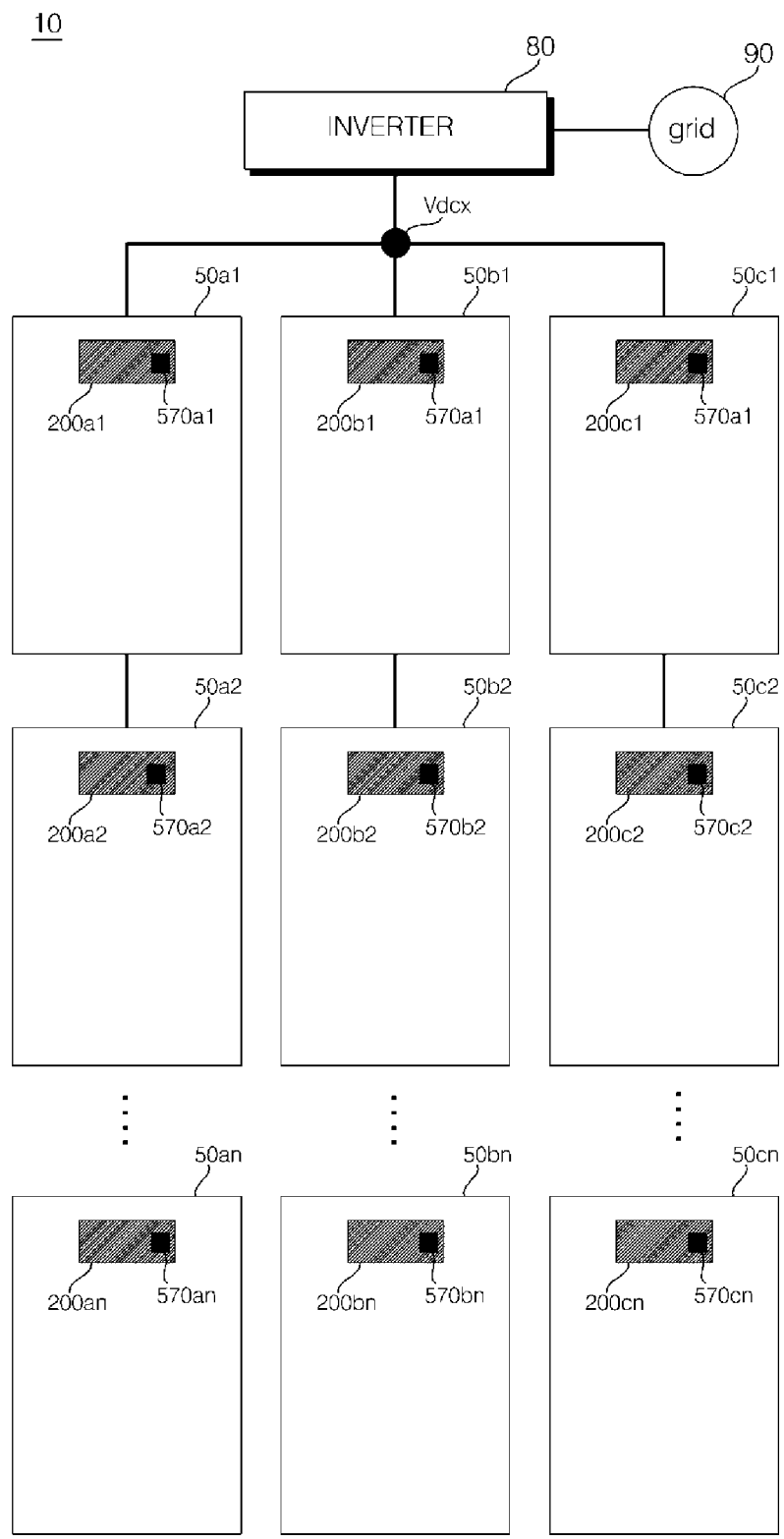
FIG. 1 is a diagram illustrating a photovoltaic system according to an embodiment of the present invention.

FIG. 1 is a diagram illustrating a photovoltaic system according to an embodiment of the present invention.

Referring to FIG. 1, a photovoltaic system 10 according to an embodiment may include a plurality of photovoltaic modules 50a1 to 50an, 50b1 to 50bn, and 50c1 to 50cn, and a string inverter 80.

The plurality of photovoltaic modules 50a1 to 50an, 50b1 to 50bn, and 50c1 to 50cn may be divided into a plurality of strings.

In the figure, some photovoltaic modules 50a1 to 50an are connected in series in a first string, some other photovoltaic modules 50b1 to 50bn are connected in series in a second string, and the other photovoltaic modules 50c1 to 50cn are connected in series in a third string.

Each solar module may output a direct current (DC) power of 30 V to 40 V. When 10 to 12 photovoltaic modules constitute one string, a voltage of about 300 V to 480 V is supplied to the string inverter 80.

The string inverter 80 may receive a voltage of several hundred volts, convert the same into an alternating current (AC) power and output the AC power.

For example, the string inverter 80 may include a full-bridge inverter. Namely, an upper-arm switching element Sa, Sb is connected to a lower-arm switching element S'a, S'b in series to form one pair, and thus two pairs of upper-arm and lower-arm switching elements are connected in parallel (Sa&S'a, Sb&S'b). Each of the switching elements Sa, S'a, Sb, S'b is connected with a diode in reverse parallel.

Preferably, but not necessarily, the AC power output from the string inverter 80 has the same frequency (approximately 60 Hz or 50 Hz) as the AC frequency of the grid.

According to the standards of each nation, when a high voltage outside of a permissible range is applied, the device should be shut down momentarily to secure stability of the apparatus.

According to certain national standards, the output voltage of the device should be reduced to less than 30 V within 10 seconds.

Accordingly, the present invention proposes that, when a high voltage outside of the permissible range is generated in the photovoltaic system 10 including the plurality of photovoltaic modules 50a1 to 50an, 50b1 to 50bn, and 50c1 to 50cn and the string inverter 80, the system be shut down momentarily.

More specifically, according to an embodiment of the present invention, in the solar system 10 including the plurality of photovoltaic modules 50a1 to 50an, 50b1 to 50bn, and 50c1 to 50cn and the string inverter 80, a shutdown unit 570 is provided in at least a part of the photovoltaic modules 50a1 to 50an, 50b1 to 50bn, and 50c1 to 50cn, and when a voltage outside a permissible range is generated in the photovoltaic module, the shutdown unit 570 shall temporarily interrupt power output.

Particularly, when the DC power from the solar cell module in the photovoltaic module is outside of the permissible range, the shutdown unit 570 (see FIG. 6) may operate to consume the DC power stored in a capacitor unit (520 in FIG. 6) and temporarily interrupt the power output. Accordingly, when DC power outside of the permissible range is supplied, the power output may be quickly interrupted while the DC power stored in the capacitor unit (520 in FIG. 6) is consumed.

Particularly, it is possible to interrupt the power output while consuming the DC power stored in the capacitor unit (520 in FIG. 6) much more quickly than when shutdown is performed in the string inverter 80. Thus, stability of the entire photovoltaic system 10 may be improved.

In the figure, shutdown units 570a1 to 570an, 570b1 to 570bn, and 570c1 to 570cn are illustrated as being provided in the junction boxes 200a1 to 200an, 200b1 to 200bn, and 200c1 to 200cn of the photovoltaic modules 50a1 to 50an, 50b1 to 50bn, and 50c1 to 50cn.

Thus, shutdown is performed on each of the junction boxes 200a1 to 200an, 200b1 to 200bn, and 200c1 to 200cn of the plurality of photovoltaic modules 50a1 to 50an, 50b1 to 50bn, and 50c1 to 50cn, and therefore the stability of the entire photovoltaic system 10 as well as the stability of the photovoltaic modules 50a1 to 50an, 50b1 to 50bn, and 50c1 to 50cn may be improved.

According to another embodiment, the photovoltaic modules 50a1 to 50an, 50b1 to 50bn, and 50c1 to 50cn include a solar cell module 100 having a plurality of solar cells, and a junction box (200 in FIG. 6) attached to the back surface of the solar cell module 100. The junction box includes a capacitor unit (520 in FIG. 6) for storing the DC power from the solar cell module, and a shutdown unit 570 operating to bypass and output the DC power from the solar cell module 100 when the DC power from the solar cell module 100 is within a permissible range and to interrupt the DC power output from the solar cell module 100 and consume the DC power stored in the capacitor unit (520 in FIG. 6) when the DC power from the solar cell module 100 is outside of the permissible range. Accordingly, when DC power outside of the permissible range is supplied, the power output may be quickly interrupted while the DC power stored in the capacitor unit (520 in FIG. 6) is consumed.

Specifically, when the signal level of a detected current detected by a current detector is lower than a level for turning on a second switching element, the shutdown unit 570 bypasses and outputs the DC power from the solar cell module. When the signal level of the detected current detected by the detector is equal to or higher than the level for turning on the second switching element, the shutdown unit 570 operates to consume the DC power stored in the capacitor unit (520 in FIG. 6) is consumed along with interruption of the DC power output from the solar cell module. Thereby, when DC power outside of the permissible range is supplied, the power output may be quickly interrupted while the DC power stored in the capacitor unit (520 in FIG. 6) is consumed.

Figure 3:
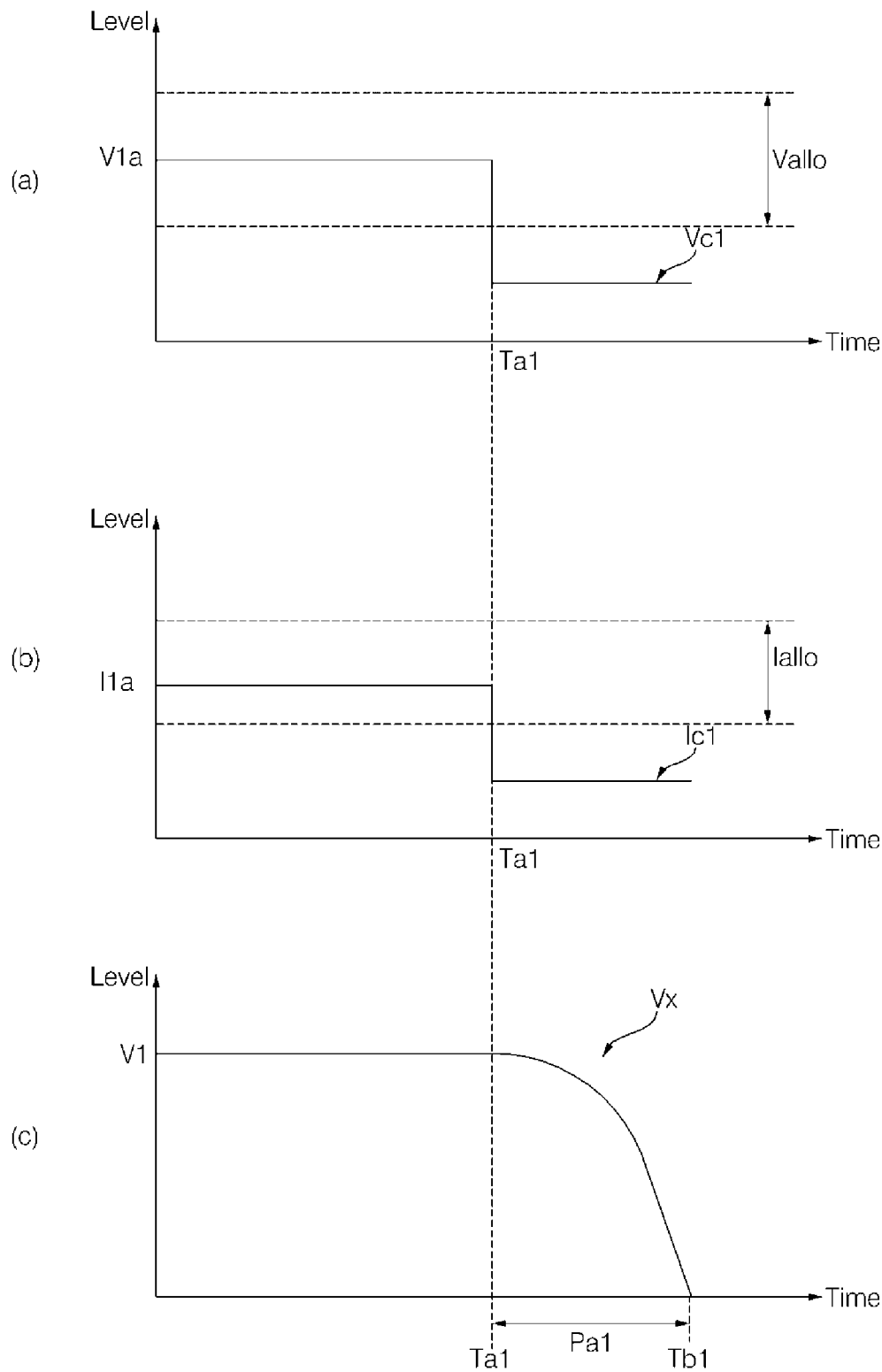
FIG. 3 is a reference diagram illustrating the operation of the shutdown unit of FIG. 2.

FIG. 2 is a diagram showing an example of the shutdown unit in the solar module of FIG. 1, and FIG. 3 is a reference diagram illustrating the operation of the shutdown unit of FIG. 2.

In FIG. 2, (a) illustrates a circuit of the shutdown unit 570.

Referring to (a) in FIG. 2, the shutdown unit 570 may include a first switching element stt1, a current detector 574 for detecting a current Ix flowing through the first switching element stt1, and a resistor Ra and a second switching element stt2 which are connected in parallel to the first switching element stt1.

The current detector 574 may detect the current Ix flowing through the first switching element stt1 and output a detection signal Idt corresponding to the detected current Ix.

The second switching element stt2 may be turned on or off based on the detection signal Idt detected by the current detector 574.

For example, when the level of the detection signal Idt is equal to or higher than a level for turning on the second switching element stt2, the second switching element stt2 may be turned on.

The level for turning on the second switching element stt2 may be a value corresponding to a permissible range of the DC power level of the solar cell module 50 described above.

To respond to this level, it is preferable, but not required, to match the resistance value of the resistor Rb in the figure.

Since the second switching element stt2 is automatically turned on or off based on the signal detected by the current detector 574 as described above, shutdown may be automatically performed, and thus stability of the photovoltaic module 50 may be improved.

In FIG. 2, (b) illustrates that when the second switching element stt2 is turned off with the first switching element stt1 of the shutdown unit 570 turned on, the current path is formed as Path1, and the input DC power is bypassed and output.

In FIG. 2, (b) also illustrates that when the second switching element stt2 is turned on with the first switching element stt1 turned on, the current path is formed as Path2, and the resistor Ra is turned on, the input DC power is consumed. That is, the DC power stored in the capacitor unit (520 in FIG. 6) may be quickly consumed.

In FIG. 2, (c) illustrates that, after the second switching element stt2 is turned on, the first switching element stt1 is turned off and the input DC power is not output. With this operation, the shutdown unit 570 does not output the DC power from the solar cell module 100.

The voltage output waveform Vx of the photovoltaic module 50 according to the operation of the shutdown unit 570 of FIG. 2 may be illustrated as shown in FIG. 3.

Referring to (a) of FIG. 3, when the DC voltage Vc1 stored in the capacitor unit (520 in FIG. 6) in the photovoltaic module 50 is a voltage V1a of about 30 to 40 V that is within a permissible range Vallo, the first switching element stt1 is turned on and the second switching element stt2 is turned off.

When the DC voltage Vc1 stored in the capacitor unit (520 in FIG. 6) in the photovoltaic module 50 falls below the permissible range (Vallo) after time Ta1, the second switching element stt2 may be turned on. Thereby, a current path such as path2 in (b) of FIG. 2 is formed, and thus the DC power stored in the capacitor unit (520 in FIG. 6) is consumed. Accordingly, the output voltage of the photovoltaic module 50 is lowered as shown in (c) of FIG. 3.

When the first switching element stt1 is turned off after the second switching element stt2 is turned on as shown in (c) of FIG. 2, the output voltage of the photovoltaic module 50 falls to the ground GND as shown in (c) of FIG. 3.

For the operation of the shutdown unit 570 as described above, a period of approximately Pa1 from time Ta1 outside of the permissible range to time Tb1, at which the lowered output power is the ground GND, is required.

Accordingly, the photovoltaic module 50 may quickly interrupt the power output when DC power outside of the permissible range is supplied.

Further, the photovoltaic system 10 may quickly lower the voltage when shutdown is performed.

Referring to (b) of FIG. 3, when the DC current Ic1 flowing to the capacitor unit (520 in FIG. 6) in the photovoltaic module 50 is the voltage I1a which is within a permissible range Iallo, the switching element stt1 may be turned on and the second switching element stt2 may be turned off.

When the DC current Ic1 flowing to the capacitor unit (520 in FIG. 6) in the photovoltaic module 50 falls below a permissible range Iallo after time Ta1 as shown in the figure, the second switching element stt2 may be turned on. Thereby, a current path such as path2 in (b) of FIG. 2 is formed, and thus the DC power stored in the capacitor unit (520 in FIG. 6) is consumed. Accordingly, the output voltage of the photovoltaic module 50 is lowered as shown in (c) of FIG. 3.

When the first switching element stt1 is turned off after the second switching element stt2 is turned on as shown in (c) of FIG. 2, the output voltage of the photovoltaic module 50 falls to the ground GND as shown in (c) of FIG. 3.

For the operation of the shutdown unit 570 as described above, a period of approximately Pa1 from time Ta1 outside of the permissible range to time Tb1, at which the lowered output power is the ground GND, is required.

Accordingly, the photovoltaic module 50 may quickly interrupt the power output when DC power outside of the permissible range is supplied.

Further, the photovoltaic system 10 may quickly lower the voltage when shutdown is performed.

Figure 4:
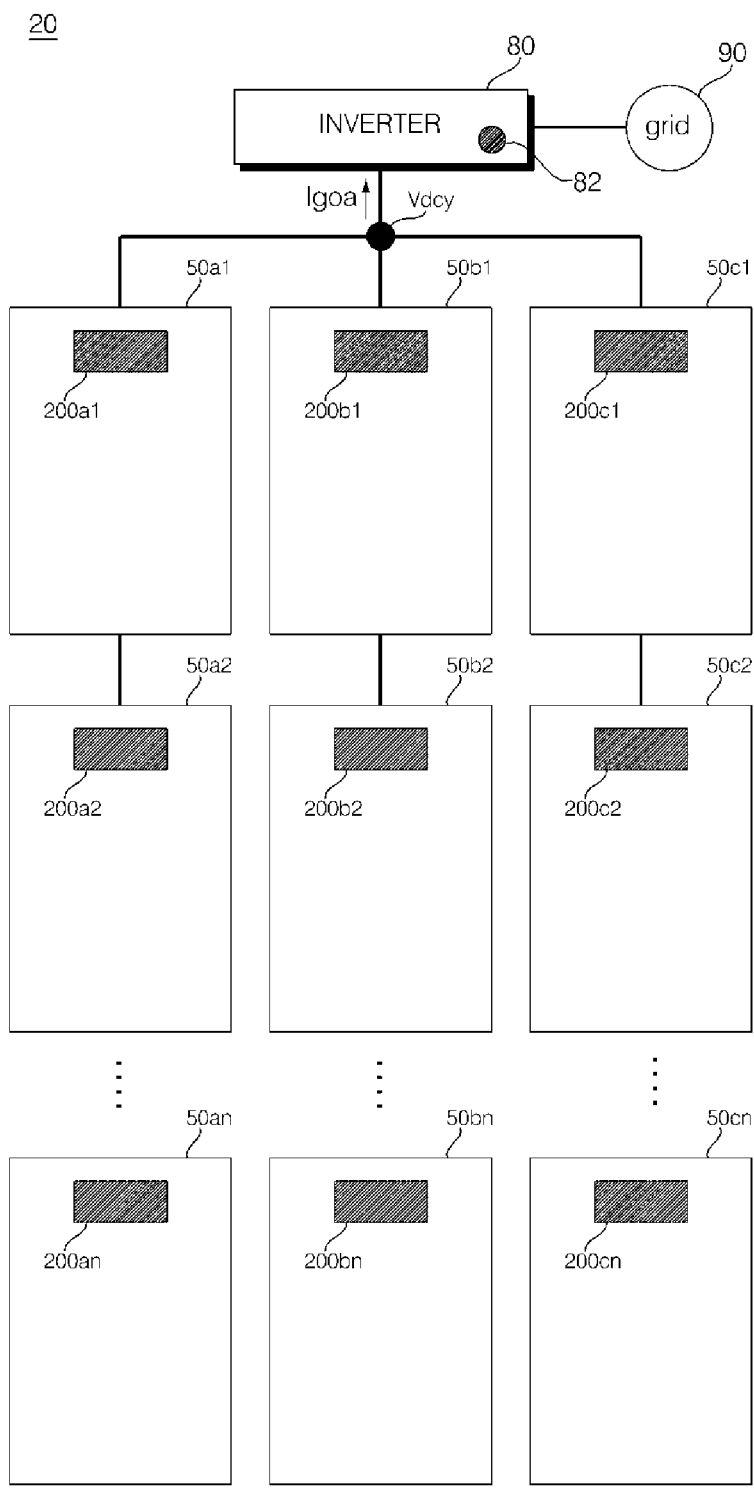
FIG. 4 is a diagram showing a photovoltaic system for comparison with the photovoltaic system of FIG. 1.

FIG. 4 is a diagram showing a photovoltaic system for comparison with the photovoltaic system of FIG. 1, and FIG. 5 is a reference diagram illustrating the operation of the photovoltaic system of FIG. 4.

Similar to the photovoltaic system 10 of FIG. 1, the photovoltaic system 10 of FIG. 4 may include a plurality of photovoltaic modules 50a1 to 50an, 50b1 to 50bn, and 50c1 to 50cn and a string inverter 80.

The plurality of photovoltaic modules 50a1 to 50an, 50b1 to 50bn, and 50c1 to 50cn may be divided into a plurality of strings.

The photovoltaic system 20 of FIG. 4 is characterized in that the string inverter 80 has a function to perform shutdown when a voltage outside a permissible range is applied.

That is, the string inverter 80 may include a shutdown unit 82. The permissible value may be approximately 10 to 12 times the permissible value of the photovoltaic module described in FIGS. 1 to 3.

When the string inverter 80 is provided with the shutdown unit 82 as shown in the figure, a considerable time is taken to lower the voltage of several hundred volts to the ground voltage.

FIG. 5 illustrates the input voltage waveform Vdcy of the string inverter 80.

Referring to FIG. 5, when the current flowing through the string inverter 80 which is maintained at I1ax within a permissible range Iallox falls below the permissible range Iallox after time Ta2, the shutdown unit 82 in the switch 80 may operate and eventually the voltage may fall to the ground voltage.

The period from time Ta2, at which the voltage begins to fall outside of the permissible range, to time Tsb2, at which the voltages reaches the ground voltage, may be exemplified as Pa2 as shown in the figure.

It can be seen that Pa2 in FIG. 5 is considerably long, compared to Pa1 in FIG. 3.

When the voltage supplied to the string inverter 80 is outside of a permissible range Vallox, the shutdown unit 82 in the string inverter 80 may operate. In this instance, as the voltage is high, a considerable time is required for the voltage to fall to the ground voltage during shutdown.

As a result, according to the methods shown in FIGS. 4 and 5, it is difficult to cope with the standards of the respective countries described above.

Therefore, as shown in FIGS. 1 to 3, it is preferable, but not required, that the shutdown unit 570 be provided and operated in at least one photovoltaic module in the photovoltaic system 10.

Figure 6:
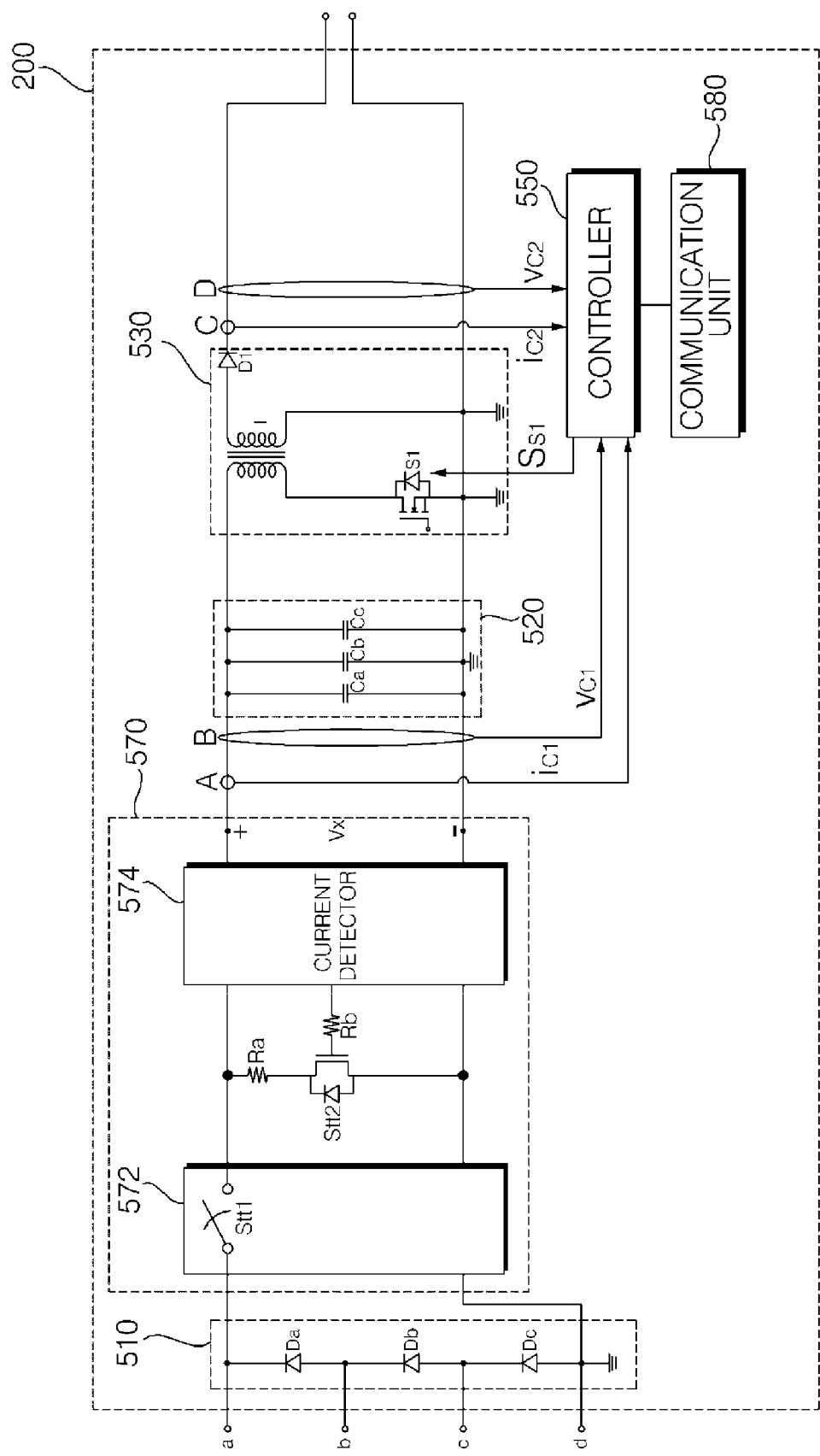
FIG. 6 shows an example circuit diagram inside a junction box in the photovoltaic module of FIG. 1.

FIG. 6 shows an example circuit diagram inside a junction box in the photovoltaic module of FIG. 1.

Referring to FIG. 6, the junction box 200 may convert the DC power from the solar cell module 100 and output the converted power.

Particularly, in the present invention, the junction box 200 may output DC power.

To this end, the junction box 200 may include a capacitor unit 520 for storing DC power, a converter unit 530, and a controller 550 for controlling the converter unit 530.

The junction box 200 may further include a bypass diode unit 510 for the bypassing operation.

The junction box 200 may further include a communication unit 580 for communicating with other external photovoltaic modules or the string inverter 80.

Regarding the present invention, the junction box 200 may further include a shutdown unit 570 disposed at the front end of the capacitor unit 520 and operating to consume the DC power stored in the capacitor unit 520 and temporarily interrupt the power output when the DC power from the solar cell module 100 is outside of a permissible range.

The shutdown unit 570 may be disposed between the bypass diode unit 510 and the converter unit 530.

More specifically, the shutdown unit 570 may be disposed between the bypass diode unit 510 and the capacitor unit 520.

The junction box 200 may further include an input current sensing unit A, an input voltage sensing unit B, a converter output current detector C, a converter unit output voltage detector D, an inverter output current detector E, and an inverter output voltage detector F.

The controller 550 may control the converter unit 530 and the shutdown unit 570.

The bypass diode unit 510 may include bypass diodes Dc, Db, and Da disposed between the first to fourth conductive lines of the solar cell module 100, respectively. In this instance, the number of the bypass diodes is greater than or equal to one. Preferably, but not necessarily, the number of the bypass diodes is smaller than the number of the conductive lines by one.

The bypass diodes Dc, Db and Da receive the solar DC power from the solar cell module 100, particularly from the first to fourth conductive lines in the solar cell module 100. When a reverse voltage is generated from the DC power from at least one of the first to fourth conductive lines, the bypass diodes Dc, Db, and Da may bypass the reverse voltage.

The DC power passed through the bypass diode unit 510 may be input to the shutdown unit 570.

The shutdown unit 570 may operate to temporarily interrupt the power output when the level of the DC power from the solar cell module 100 is outside of the permissible range, as described with reference to FIG. 2.

Accordingly, when the DC power supplied through the bypass diode 510 is outside of the permissible range, a quick shutdown is possible since the power output can be temporarily interrupted. Furthermore, it is possible to protect the capacitor unit 520 and the circuit elements inside the converter unit 530, which are disposed at the output end of the shutdown unit 570.

The shutdown unit 570 may include a first switching element stt1, a current detector 574 for detecting a current flowing through the first switching element stt1, and a resistor Ra and a second switching element stt1 connected in parallel to the first switching element stt1. The second switching element stt2 may be turned on or off based on the signal detected by the current detector 574.

The DC power passed through the shutdown unit 570 may be input to the capacitor unit 520.

The capacitor unit 520 may store the input DC power input via the solar cell module 100 and the bypass diode unit 510.

While the capacitor unit 520 is illustrated in the figure as including a plurality of capacitors Ca, Cb, and Cc connected in parallel to each other, the plurality of capacitors may be connected in series-parallel combination, or connected to the ground terminal in series. Alternatively, the capacitor unit 520 may have only one capacitor.

The converter unit 530 may convert the level of the input voltage from the solar cell module 100 via the bypass diode unit 510 and the capacitor unit 520.

In particular, the converter unit 530 may perform power conversion using the DC power stored in the capacitor unit 520.

For example, the converter unit 530 may include a plurality of resistors or a transformer, and may perform voltage distribution with respect to an input voltage based on a set target power.

While a tapped inductor converter unit is illustrated as an example of the converter unit 530, a flyback converter unit, a buck converter unit, a boost converter unit, or the like may be employed as the converter unit 530.

The converter unit 530 shown in the figure, namely, the tapped inductor converter unit, may include a tapped inductor T, a switching element S1 connected between the tapped inductor T and the ground terminal, a diode D1 connected to the output terminal of the tapped inductor to allow current to flow in one direction.

Meanwhile, a DC link capacitor may be connected between the output terminal of the diode D1, that is, the cathode of the diode D1 and the ground terminal.

Specifically, the switching element S1 may be connected between the tap of the tapped inductor T and the ground terminal. The output terminal (secondary side) of the tapped inductor T may be connected to the anode of the diode D1 and the DC link capacitor C1 is connected between the cathode of the diode D1 and the ground terminal.

The primary and secondary sides of the tapped inductor T have opposite polarities. On the other hand, the tapped inductor T may be referred to as a switching transformer.

The switching element S1 in the converter unit 530 may be turned on/off based on the converter unit switching control signal from the controller 550. Thereby, a level-converted DC power may be output.

The input current sensing unit A may sense the input current ic1 supplied from the solar cell module 100 to the capacitor unit 520.

The input voltage sensing unit B may sense an input voltage Vc1 supplied from the solar cell module 100 to the capacitor unit 520. In this instance, the input voltage Vc1 may be equal to the voltage stored in the capacitor unit 520.

The sensed input current ic1 and the sensed input voltage vc1 may be input to the controller 550.

The converter output current detector C detects an output current ic2 output from the converter unit 530, i.e., the dc link current, and the converter unit output voltage detector D detects an output voltage vc2, i.e., the dc link voltage output from the converter unit 530. The detected output current ic2 and the detected output voltage vc2 may be input to the controller 550.

Meanwhile, the controller 550 may output a control signal for controlling the switching element S1 of the converter unit 530. In particular, the controller 550 may output a turn-on timing signal of the switching element S1 in the converter unit 530 based on at least one of the input current ic1, the input voltage vc1, the output current ic2, the output voltage vc2, the output current ic3 and the output voltage vc3.

The controller 550 may calculate the maximum power point for the solar cell module 100 and correspondingly control the converter unit 530 to output DC power corresponding to the maximum power.

When the DC power from the solar cell module 100 is outside of a permissible range, for example, when the detected input current ic1 and the detected input voltage vc1 are out of permissible ranges therefor, the controller 550 may control the shutdown unit 570 to operate.

For example, when the DC power from the solar cell module 100 is outside of the permissible range, the controller 550 may first control the second switching element S2 to be turned on with the first switching element S1 turned on, as shown in (b) of FIG. 2. Thereby, the DC power stored in the capacitor unit 520 is consumed, and therefore the circuit elements may be protected.

Next, the controller 550 may control the first switching element S1 to be turned off as shown in (c) of FIG. 2. As a result, the DC power from the solar cell module 100 is not output, and the output power of the solar cell module 50 falls to the ground. Thus, a quick shutdown is possible.

Meanwhile, the communication unit 580 may perform communication with other photovoltaic modules or the string inverter 80.

For example, the communication unit 580 may exchange data with other photovoltaic modules or the string inverter 80 by power line communication.

The communication unit 580 may receive a shutdown signal from other photovoltaic modules or the string inverter 80.

The controller 550 may control the shutdown unit 570 to operate based on the received shutdown signal. In particular, the controller 550 may control the first switching element Stt1 to be turned off.

The communication unit 580 may transmit current information, voltage information, power information, and the like about the photovoltaic module 50 to other photovoltaic modules or the string inverter 80.

In contrast with FIG. 6, the shutdown unit 570 may be disposed at the output terminal of the converter unit 530.

The shutdown unit 570 may operate to temporarily interrupt the power output when the level of the DC power of the converter unit 530 is outside of the permissible range, as described with reference to FIG. 2.

In this manner, the power output can be temporarily interrupted when the DC power of the converter unit 530 is outside of the permissible range. Therefore, a quick shutdown is possible.

Figure 7A:
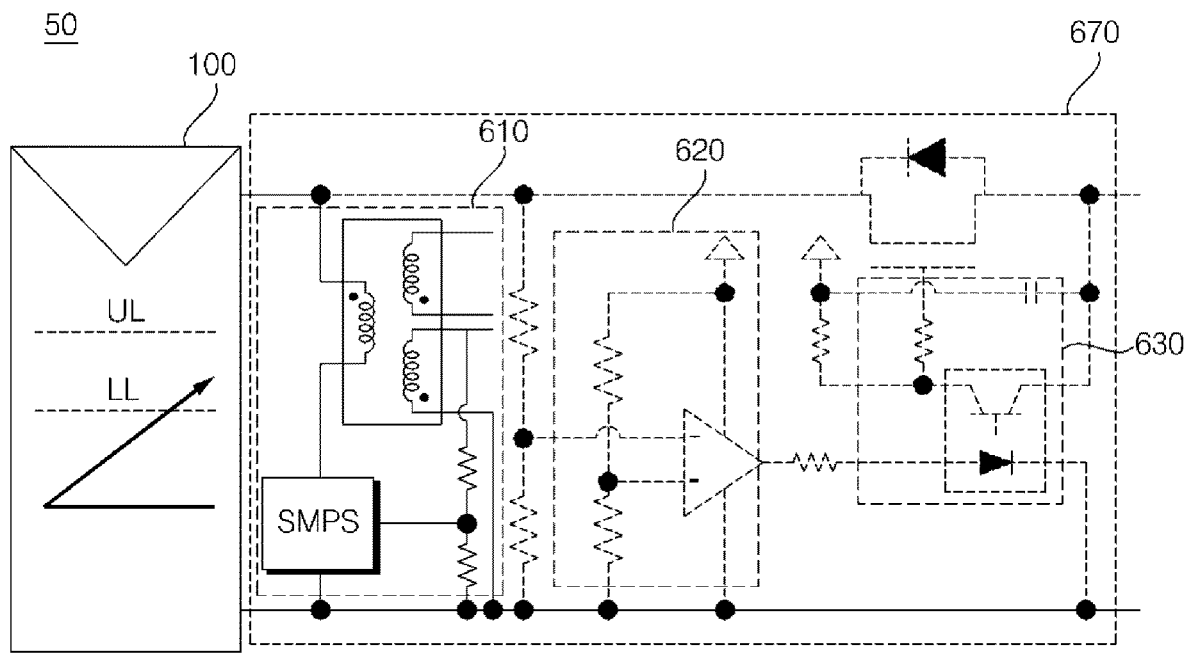
FIGS. 7A to 7C are diagrams illustrating another example of the shutdown unit in the photovoltaic module of FIG. 1.
Figure 7B:
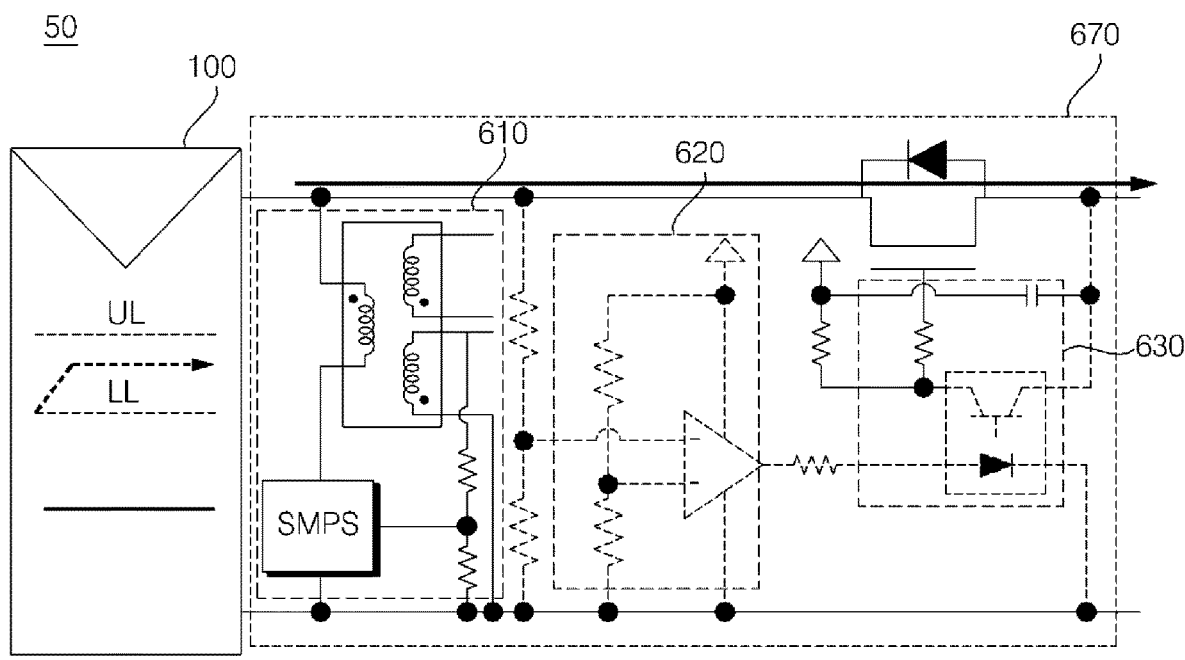
Figure 7C:
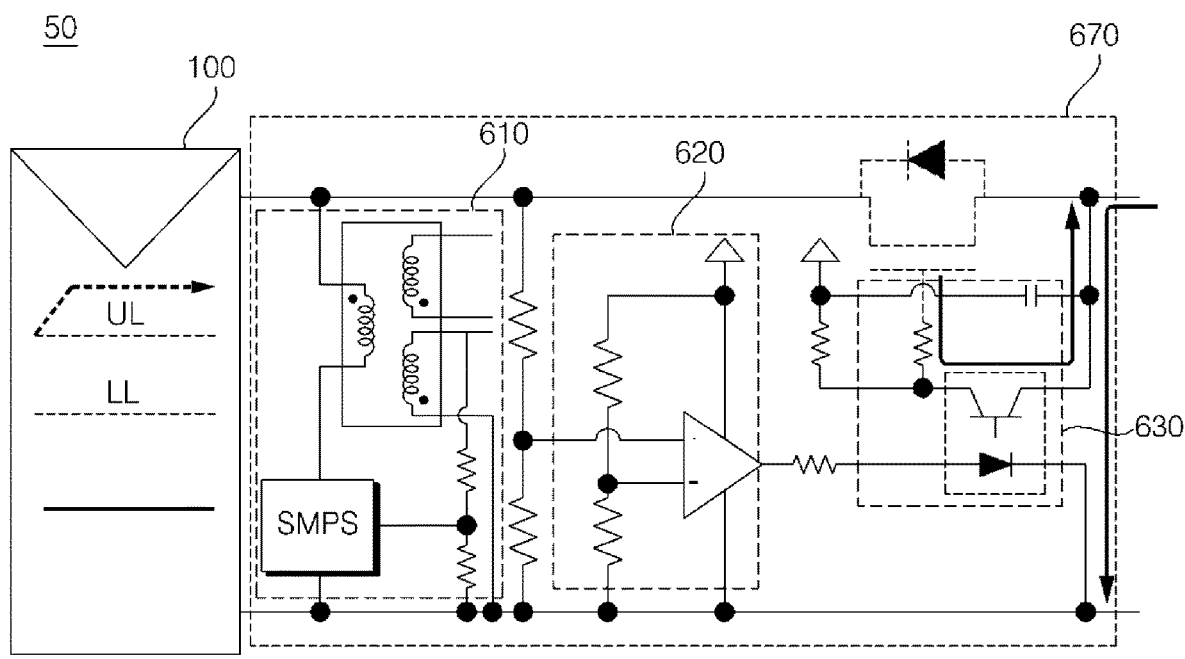

FIGS. 7A to 7C are diagrams illustrating another example of the shutdown unit in the photovoltaic module of FIG. 1.

The shutdown unit 670 of FIGS. 7A to 7C may include a switching unit 630 operating to bypass and output the DC power from the solar cell module 100 by a switching operation and to be turned off so as not to output the DC power from the solar cell module 100 when the DC power from the photovoltaic module 100 is outside of a permissible range.

The shutdown unit 670 of FIGS. 7A to 7C may further include an operation power generator 610 for generating a switching operation power based on the DC power from the solar cell module 100, and a comparator 620 for performing a comparison operation to determine whether or not the DC power from the solar cell module is outside of a permissible range.

The operation power generator 610 may generate a power for the operation of the SMPS in the initial operation and thereafter generate a gate driving power for the switching elements in the switching unit 630 in the normal operation.

The generated gate driving power may be supplied to a switching element in the switching unit 630.

Meanwhile, the comparator 620 may include an operational amplifier (op-amp) and perform a comparison operation to determine whether or not the DC power from the solar cell module 100 is outside of the permissible range.

The comparator 620 may output a high level signal when the DC power is outside of the permissible range and may output a low level signal when the DC power is within the permissible range.

The switching element in the switching unit 630 may be turned off according to the high level signal, and may be turned on according to the low level signal.

FIGS. 7A and 7B illustrate an instance where the DC voltage of the solar cell module 100 is higher than or equal to a lower limit value LL and lower than or equal to a permissible value UL. In this instance, the switching unit 630 is turned on, and the DC voltage of the solar cell module 100 is bypassed and output.

FIG. 7C illustrates an instance where the DC voltage of the solar cell module 100 is higher than or equal to the permissible value UL. In this instance, the switching unit 630 is turned off, and thus the output of the DC voltage of the solar cell module 100 is interrupted. Accordingly, a quick shutdown is possible.

The shutdown unit 670 shown in FIGS. 7A to 7C may be disposed between the bypass diode unit 510 and the capacitor unit 520 as shown in FIG. 6, or may be disposed at the output terminal of the converter unit 530.

Figure 8:
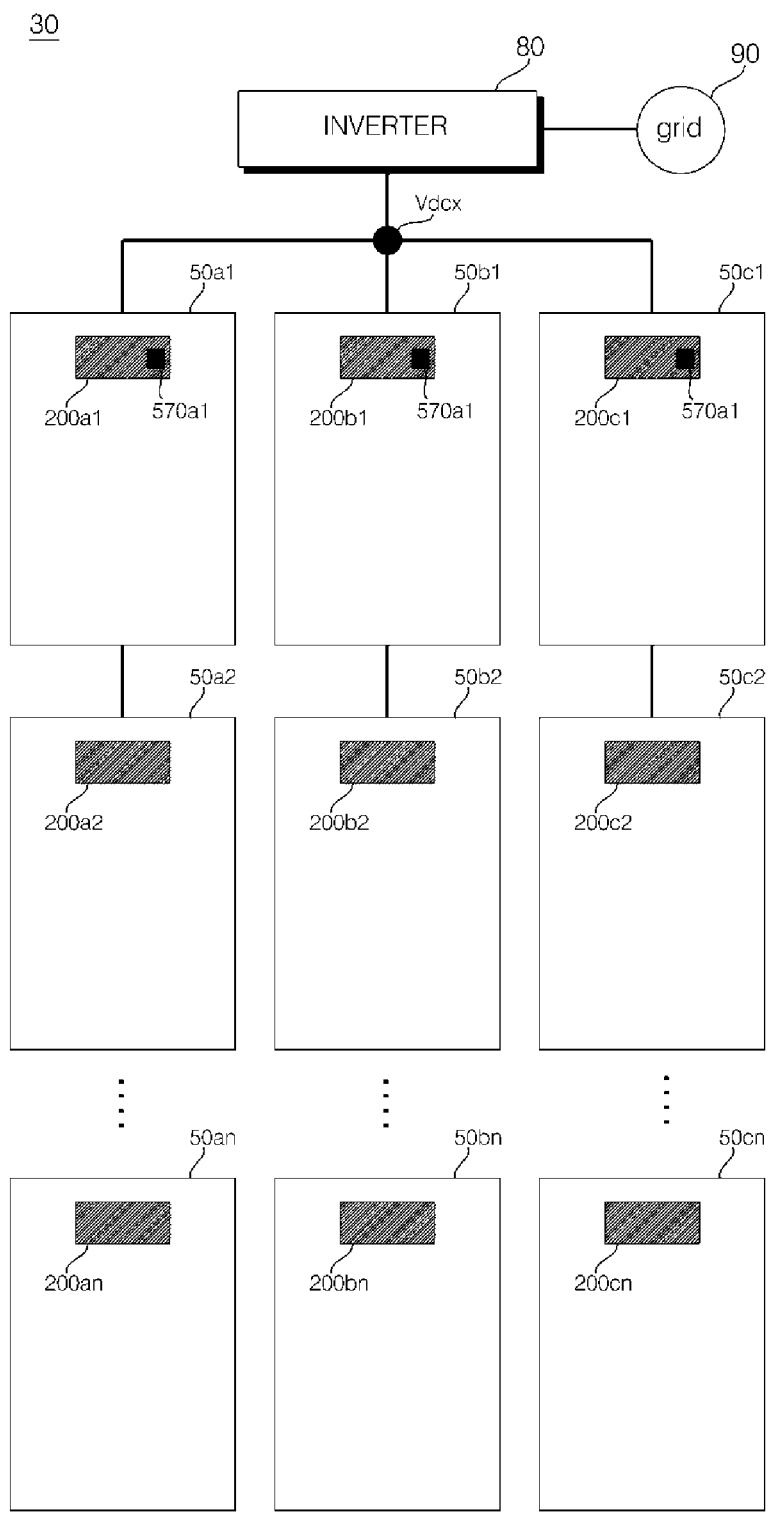
FIG. 8 is a diagram illustrating a photovoltaic system according to another embodiment of the present invention.

FIG. 8 is a diagram illustrating a photovoltaic system according to another embodiment of the present invention.

The photovoltaic system 30 of FIG. 8 is similar to the photovoltaic system 10 of FIG. 1, except that the shutdown unit is provided to only the photovoltaic modules 50an, 50bn, and 50cn disposed at the end terminal of each string, rather than being provided to all the photovoltaic modules 50a1 to 50an, 50b1 to 50bn, and 50c1 to 50cn.

Figure 9:
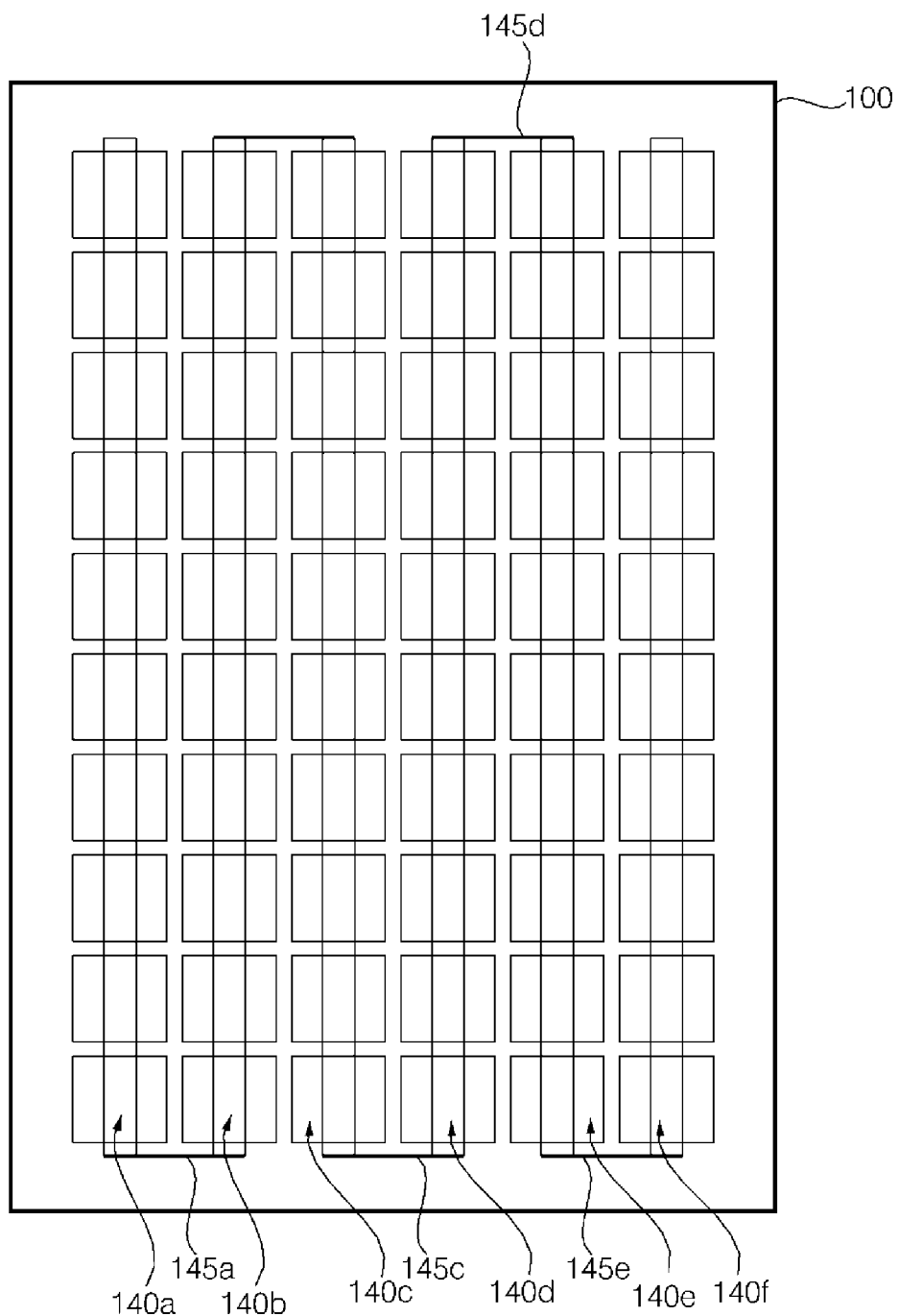
FIG. 9 is a front view of a photovoltaic module according to an embodiment of the present invention.
Figure 10:
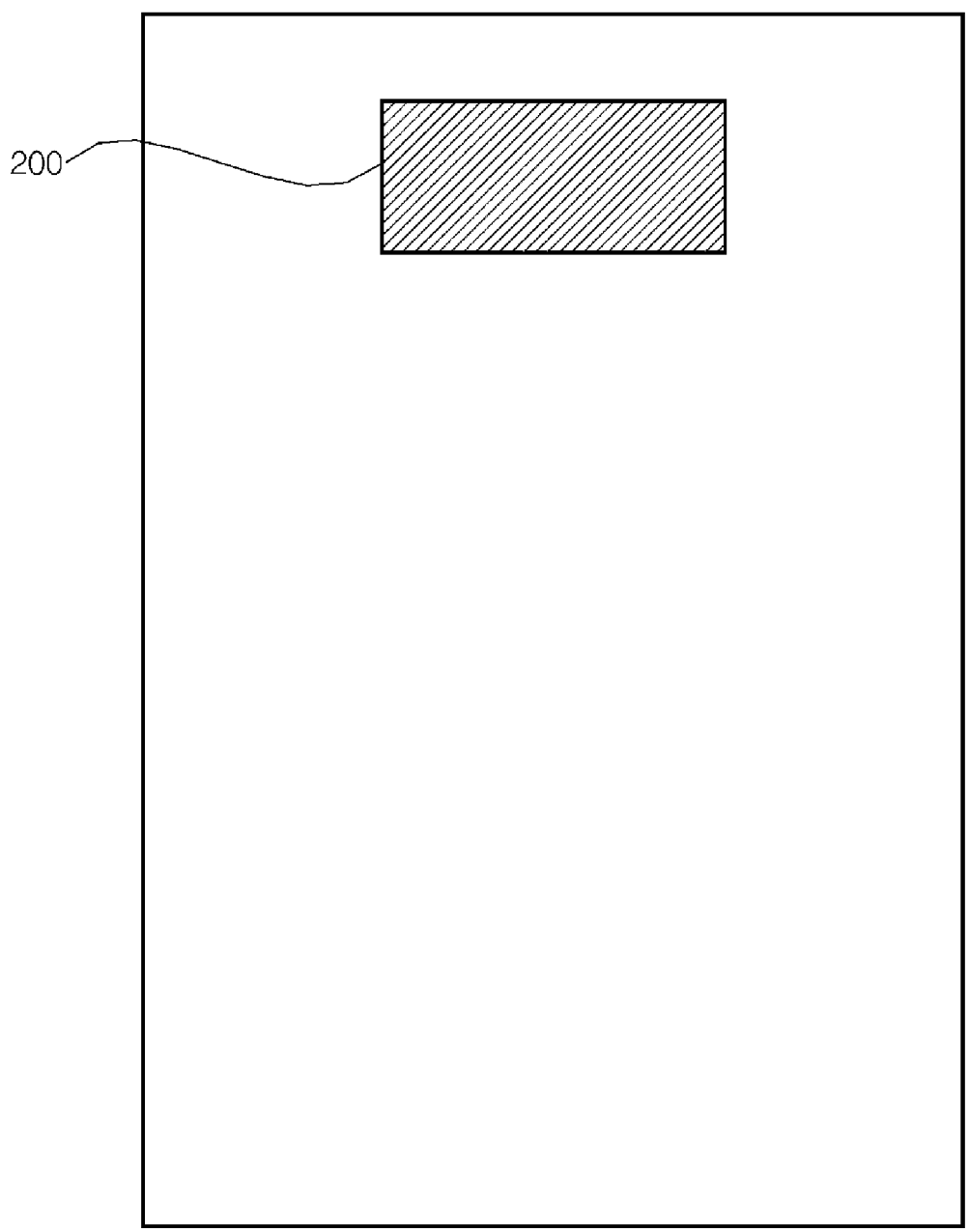
FIG. 10 is a rear view of the photovoltaic module of FIG. 9.

FIG. 9 is a front view of a photovoltaic module according to an embodiment of the present invention, and FIG. 10 is a rear view of the photovoltaic module of FIG. 9.

Referring to FIGS. 9 and 10, a photovoltaic module 50 according to an embodiment may include a solar cell module 100 and a junction box 200 positioned on the back surface of the solar cell module 100.

The junction box 200 may include at least one bypass diode that is bypassed in order to prevent hot spots in instances of shadow occurrence or the like.

In FIG. 6 and the like, three bypass diodes (Da, Db, and Dc in FIG. 6) are provided according to the four solar cell strings of FIG. 9.

Meanwhile, the junction box 200 may convert the DC power supplied from the solar cell module 100. This operation will be described with reference to FIG. 6 and the following figures.

The solar cell module 100 may include a plurality of solar cells.

The figures illustrate that a plurality of solar cells is connected in series by ribbons (133 in FIG. 11) to form a solar cell string 140. Thereby, six strings 140a, 140b, 140c, 140d, 140e and 140f are formed, each of which includes ten solar cells. Various modifications may be made to the illustrated example.

The respective solar cell strings may be electrically connected by bus ribbons. FIG. 9 illustrates that the first solar cell string 140a is electrically connected with the second solar cell string 140b, the third solar cell string 140c is electrically connected with the fourth solar cell string 140d, and the fifth solar cell string 140e is electrically connected with the sixth solar cell string 140f, by the bus ribbons 145a, 145c and 145e disposed at the lower portion of the solar cell module 100, respectively.

FIG. 9 also illustrates that the second solar cell string 140b is electrically connected with the third solar cell string 140c, and the third solar cell string 140d is electrically connected with the fifth solar cell string 140e, by the bus ribbons 145b and 145d disposed at the upper portion of the solar cell module 100, respectively.

The ribbon connected to the first string, the bus ribbons 145b and 145d, and the ribbon connected to the fourth string may be electrically connected to the first to fourth conductive lines, respectively. The first to fourth conductive lines may be electrically connected to the bypass diodes (Da, Db, and Dc in FIG. 6) in the junction box 200 disposed on the back surface of the solar cell module 100, through openings formed in the solar cell module 100.

Figure 11:
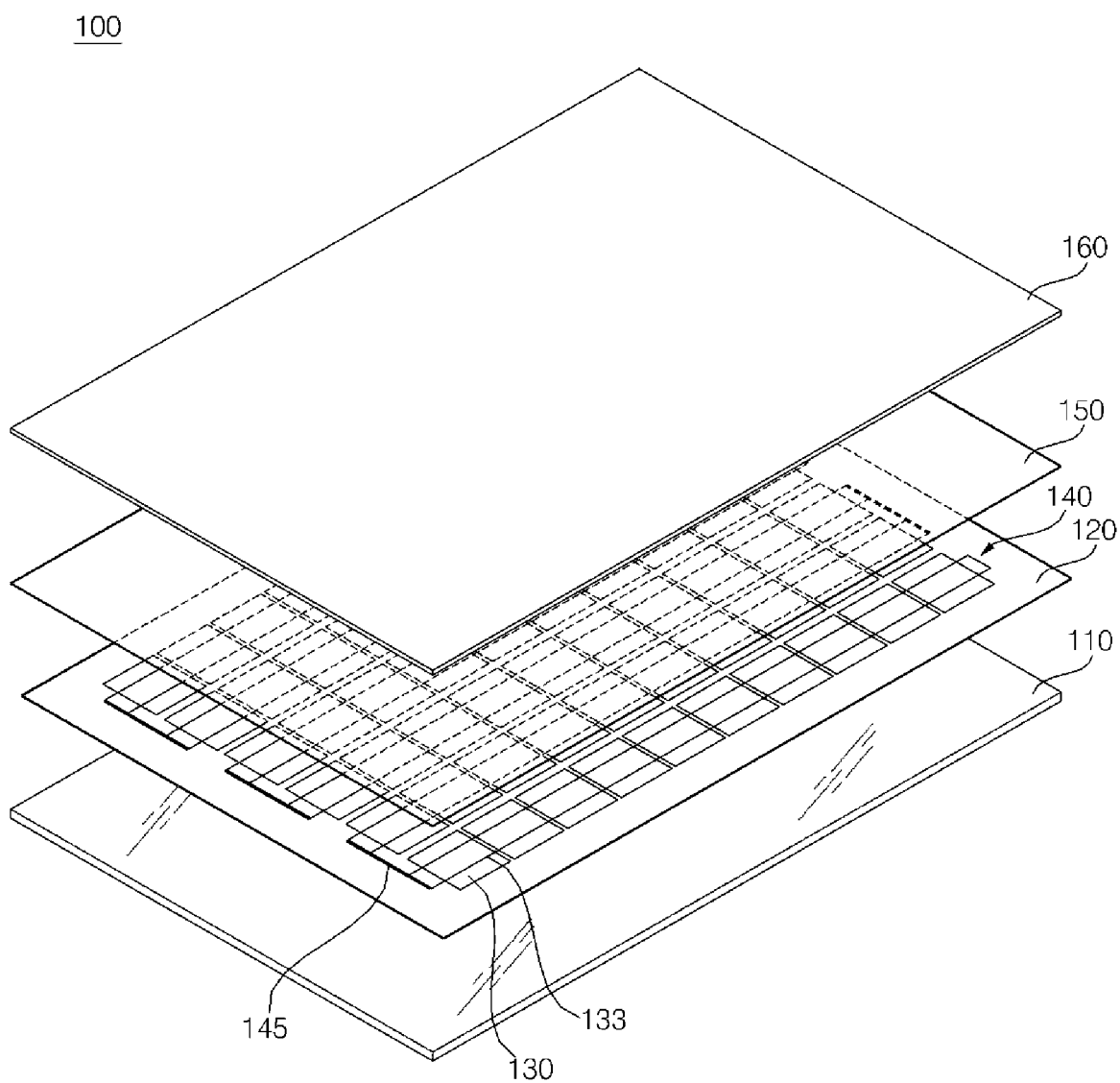
FIG. 11 is an exploded perspective view of the solar cell module of FIG. 9.

FIG. 11 is an exploded perspective view of the solar cell module of FIG. 9.

Referring to FIG. 11, the solar cell module 100 of FIG. 9 may include a plurality of solar cells 130. The solar cell module 100 may further include a first sealing member 120 and a second sealing member 150 located on the lower surface and the upper surface of the plurality of solar cells 130, a rear substrate 110 located on the lower surface of the first sealing member 120, and a front substrate 160 located on the upper surface of the second sealing member 120.

The solar cell 130 is a semiconductor device that converts sunlight into electrical energy. The solar cell 130 may be a silicon solar cell, a compound semiconductor solar cell, a tandem solar cell, a dye-sensitized, CdTe, or CIGS type solar cell, a thin film solar cell, or the like.

The solar cell 130 includes a light receiving surface onto which sunlight is incident and a surface opposite to the light receiving surface. For example, the solar cell 130 may include a silicon substrate of a first conductive type, a second conductive type semiconductor layer formed on the silicon substrate and having a conductive type opposite to the first conductive type, an antireflection film formed on the second conductive type semiconductor layer and having at least one opening exposing a part of the surface of the second conductive type semiconductor layer, a front electrode contacting the part of the surface of the second conductive type semiconductor layer exposed through the at least one opening, and a rear electrode formed on the rear surface of the silicon substrate.

The respective solar cells 130 may be electrically connected in series, parallel, or series-parallel. Specifically, the plurality of solar cells 130 may be electrically connected by a ribbon 133. The ribbon 133 may be bonded to the front electrode formed on the light receiving surface of a solar cell 130 and the rear electrode formed on the opposite surface of an adjacent solar cell 130.

FIG. 11 illustrates that the ribbon 133 is formed in two rows, and the solar cells 130 are connected in a row by the ribbon 133 to form the solar cell string 140.

Thus, six strings 140a, 140b, 140c, 140d, 140e and 140f may be formed as described with reference to FIG. 9, and each string may include ten solar cells.

The rear substrate 110 may have waterproof, insulating and ultraviolet shielding functions as a back sheet, and may have a TPT (Tedlar/PET/Tedlar) structure. However, embodiments of the present invention are not limited thereto. While the rear substrate 110 is illustrated in FIG. 6 as having a rectangular shape, the rear substrate 110 may be fabricated in various shapes such as a circular shape and a semicircular shape depending on the environment in which the solar cell module 100 is installed.

The first sealing member 120 may have the same size as that of the rear substrate 110 and be attached to the rear substrate 110, and the plurality of solar cells 130 may be positioned adjacent to each other on the first sealing member 120 such that the solar cells 130 are arranged in several rows.

The second sealing member 150 may be positioned on the solar cells 130 and be bonded to the first sealing member 120 by lamination.

In this instance, the first sealing member 120 and the second sealing member 150 allow the elements of the solar cell to be chemically bonded. Examples of the first sealing member 120 and the second sealing member 150 may include an ethylene vinyl acetate (EVA) film.

The front substrate 160 is preferably but not necessarily, positioned on the second sealing member 150 so as to transmit sunlight, and is preferably, but not necessarily, made of tempered glass in order to protect the solar cells 130 from external shock or the like. More preferably, but not necessarily, the front substrate 160 is made of tempered low-iron glass having a low iron content in order to prevent reflection of sunlight and increase the transmittance of sunlight.

The solar cell module and the photovoltaic system including the same according to the present invention are not limited to the configurations and methods of the embodiments described above. Variations may be made to the embodiments described above by selectively combining all or some of the embodiments.

As is apparent from the above description, a photovoltaic module and a photovoltaic system including the same according to an embodiment of the present invention include a solar cell module having a plurality of solar cells, and a junction box attached to the back surface of the solar cell module, wherein the junction box includes a capacitor unit to store DC power from the solar cell module and a shutdown unit disposed at a front end of the capacitor unit and configured to operate, when the DC power from the solar cell module is outside of a permissible range, to consume the DC power stored in the capacitor unit and temporarily interrupt power output. Thereby, when DC power outside of the permissible range is supplied, power output may be quickly interrupted, while the DC power stored in the capacitor unit is consumed.

Particularly, in a photovoltaic system in which a plurality of photovoltaic modules is connected in series, as at least one of the plurality of photovoltaic modules is provided with a shutdown unit, power output may be much more quickly interrupted while the DC power stored in the capacitor unit is consumed, than when shutdown is performed in a string inverter. Thus, the stability of the entire photovoltaic system may be improved.

The shutdown unit includes a first switching element, a current detector to detect a current flowing through the first switching element, and a resistor and a second switching element connected in parallel to the first switching element. As the second switching element is turned on and off based on a signal detected by the current detector, the shutdown may be performed automatically.

Meanwhile, the shutdown unit is disposed between a bypass diode unit and the capacitor unit, thereby protecting the circuit elements in the converter unit.

The shutdown unit includes a switching unit configured to bypass and output the DC power from the solar cell module by the switching operation and to be turned off when the DC power from the solar cell module is outside of a permissible range. Thereby, power output can be quickly interrupted when the DC power outside of the permissible range is supplied.

According to another embodiment of the present invention, there is provided a photovoltaic module including a solar cell module having a plurality of solar cells, and a junction box attached to the back surface of the solar cell module, wherein the junction box includes a capacitor unit to store DC power from the solar cell module, and a shutdown unit configured to bypass and output the DC power from the solar cell module when the DC power from the solar cell module is within the permissible range and to interrupt the DC power output from the solar cell module and consume the DC power stored in the capacitor unit when the DC power from the solar cell module is outside of the permissible range. Thus, when the DC power outside of the permissible range is supplied, power output may be quickly interrupted and the DC power stored in the capacitor unit is consumed.

In particular, if the signal level of a detected current detected by the current detector is lower than a level for turning on the second switching element, the shutdown unit bypasses and outputs the DC power from the solar cell module. If the signal level of the detected current is equal to or higher than a level for turning on the second switching element, the shutdown unit operates to interrupt output of the DC power from the solar cell module and to consume the DC power stored in the capacitor unit. Accordingly, when the DC power supply is outside of the permissible range, power output may be quickly interrupted, and the DC power stored in the capacitor unit may be consumed.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A photovoltaic module comprising:
a solar cell module comprising a plurality of solar cells; and
a junction box attached to a back surface of the solar cell module,
wherein the junction box comprises:
a capacitor unit configured to store a direct current (DC) power from the solar cell module; and
a shutdown unit disposed at a front end of the capacitor unit and configured to operate to consume the DC power stored in the capacitor unit and temporarily interrupt power output of the solar cell module when the DC power from the solar cell module is outside of a permissible range,
wherein the shutdown unit comprises:
a first switching element;
a current detector configured to detect a current flowing through the first switching element;
a first resistor element and a second switching element connected in parallel to the first switching element; and
a second resistor element between the current detector and the second switching element,
wherein the second switching element is turned on or off based on a signal detected by the current detector,
wherein when a level of the DC power from the solar cell module is within the permissible range, the first switching element is turned on and the second switching element is turned off so that the shutdown unit bypasses the DC power and outputs the DC power to the capacitor unit,
wherein when the level of the DC power from the solar cell module is outside of the permissible range, the second switching element is turned on so that the power output is temporarily interrupted, the DC power stored in the capacitor unit is consumed, and an output voltage of the photovoltaic module is lowered,
wherein a resistance value of the second resistor matches to a level for turning on the second switching element of the permissible range of the DC power,
wherein, when a plurality of photovoltaic modules including the photovoltaic module are connected in series in a first string, DC power from the first string is supplied to the string inverter,
wherein the DC power from the first string is greater than DC power output from any one of the plurality of photovoltaic modules, and
wherein a first time to take to fall from the output voltage of the photovoltaic module to a ground voltage is less than a second time to take to fall from DC voltage supplied to the string inverter to the ground voltage.

2. The photovoltaic module according to claim 1, wherein, after the second switching element is turned on, the first switching element is turned off, and the shutdown unit does not output the input DC power.

3. The photovoltaic module according to claim 1, wherein the junction box further comprises:
a bypass diode unit having a bypass diode electrically connected to a conductive line from the solar cell module,
wherein the shutdown unit is disposed between the bypass diode unit and the capacitor unit.

4. The photovoltaic module according to claim 1, wherein the junction box further comprises:
a converter unit configured to level-convert the DC power stored in the capacitor unit.

5. The photovoltaic module according to claim 4, wherein the junction box further comprises:
a controller configured to control the converter unit and the shutdown unit.

6. The photovoltaic module according to claim 1, wherein the power output of the solar cell module is interrupted by reducing the power output to less than 30 V within 10 seconds.

7. A photovoltaic module comprising:
a solar cell module comprising a plurality of solar cells; and
a junction box attached to a back surface of the solar cell module,
wherein the junction box comprises:
a capacitor unit configured to store a direct current (DC) power from the solar cell module; and
a shutdown unit configured to operate to bypass and output the DC power from the solar cell module when the DC power from the solar cell module is within a permissible range and to interrupt the DC power output from the solar cell module and consume the DC power stored in the capacitor unit when the DC power from the solar cell module is outside of the permissible range,
wherein the shutdown unit comprises:
a first switching element;

a current detector configured to detect a current flowing through the first switching element;
a first resistor element and a second switching element connected in parallel to the first switching element; and
a second resistor element between the current detector and the second switching element,
wherein the second switching element is turned on or off based on a signal detected by the current detector,
wherein when a level of the DC power from the solar cell module is within the permissible range, the first switching element is turned on and the second switching element is turned off so that the shutdown unit bypasses the DC power and outputs the DC power to the capacitor unit,
wherein when the level of the DC power from the solar cell module is outside of the permissible range, the second switching element is turned on so that the power output is temporarily interrupted, the DC power stored in the capacitor unit is consumed, and an output voltage of the photovoltaic module is lowered,
wherein a resistance value of the second resistor matches to a level for turning on the second switching element of the permissible range of the DC power,
wherein, when a plurality of photovoltaic modules including the photovoltaic module are connected in series in a first string, DC power from the first string is supplied to the string inverter,
wherein the DC power from the first string is greater than DC power output from any one of the plurality of photovoltaic modules, and
wherein a first time to take to fall from the output voltage of the photovoltaic module to a ground voltage is less than a second time to take to fall from DC voltage supplied to the string inverter to the ground voltage.

8. The photovoltaic module according to claim 7,
wherein the shutdown unit operates to bypass and output the DC power from the solar cell module when a signal level of a detected current detected by the current detector is lower than a level for turning on the second switching element, and to interrupt the DC power output from the solar cell module and consume the DC power stored in the capacitor unit when the signal level of the detected current detected by the detector is higher than or equal to the level for turning on the second switching element.

9. The photovoltaic module according to claim 7, wherein, after the second switching element is turned on, the shutdown unit turns off the first switching element and does not output the DC power from the solar cell module.

10. A photovoltaic system comprising:
a plurality of photovoltaic modules configured to convert a direct current (DC) power from a solar cell module and to output the converted DC power; and
a string inverter configured to convert the DC power output from the plurality of photovoltaic modules into an alternating current (AC) power,
wherein each of the plurality of photovoltaic modules comprises:
a solar cell module comprising a plurality of solar cells; and
a capacitor unit configured to store the DC power from the solar cell module,
wherein at least one of the photovoltaic modules further comprises:
a shutdown unit disposed at a front end of the capacitor unit and configured to operate to consume the DC power stored in the capacitor unit and temporarily interrupt power output when the DC power from the solar cell module is outside of a permissible range,
wherein the shutdown unit comprises:
a first switching element;
a current detector configured to detect a current flowing through the first switching element;
a first resistor element and a second switching element connected in parallel to the first switching element; and
a second resistor element between the current detector and the second switching element,
wherein the second switching element is turned on or off based on a signal detected by the current detector,
wherein when a level of the DC power from the solar cell module is within the permissible range, the first switching element is turned on and the second switching element is turned off so that the shutdown unit bypasses the DC power and outputs the DC power to the capacitor unit,
wherein when the level of the DC power from the solar cell module is outside of the permissible range, the second switching element is turned on so that the power output is temporarily interrupted, the DC power stored in the capacitor unit is consumed, and an output voltage of the photovoltaic module falls to a ground,
wherein a resistance value of the second resistor matches to a level for turning on the second switching element of the permissible range of the DC power,
wherein the plurality of photovoltaic modules are connected in series in a first string, and DC power from the first string is supplied to the string inverter,
wherein the DC power from the first string is greater than DC power output from any one of the plurality of photovoltaic modules, and
wherein a first time to take to fall from the output voltage of the photovoltaic module to a ground voltage is less than a second time to take to fall from DC voltage supplied to the string inverter to the ground voltage.

11. The photovoltaic system according to claim 10, wherein a first photovoltaic module of the plurality of photovoltaic modules operates the shutdown unit based on a shutdown signal from another photovoltaic module or the string inverter to consume the DC power stored in the capacitor unit and to temporarily interrupt the power output.

12. The photovoltaic system according to claim 10, wherein, after the second switching element is turned on, the first switching element is turned off, and the shutdown unit does not output the input DC power.

13. The photovoltaic system according to claim 10, wherein the power output is interrupted by reducing the power output to less than 30 V within 10 seconds.

14. The photovoltaic module according to claim 1, wherein when the level of the DC power from the solar cell module is outside of the permissible range, the output voltage of the photovoltaic module falls to a ground.

15. The photovoltaic module according to claim 7, wherein when the level of the DC power from the solar cell module is outside of the permissible range, the output voltage of the photovoltaic module falls to a ground.

* * * * *